(12) United States Patent
Khesbak et al.

(10) Patent No.: US 11,595,006 B2
(45) Date of Patent: *Feb. 28, 2023

(54) APPARATUS AND METHODS FOR ENVELOPE TRACKING SYSTEMS WITH AUTOMATIC MODE SELECTION

(71) Applicant: Skyworks Solutions, Inc., Irvine, CA (US)

(72) Inventors: Sabah Khesbak, Irvine, CA (US); Serge Francois Drogi, Flagstaff, AZ (US); Florinel G. Balteanu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 17/093,362

(22) Filed: Nov. 9, 2020

(65) Prior Publication Data

US 2021/0167734 A1 Jun. 3, 2021

Related U.S. Application Data

(63) Continuation of application No. 16/566,309, filed on Sep. 10, 2019, now Pat. No. 10,873,297, which is a (Continued)

(51) Int. Cl.
*G06K 9/00* (2022.01)
*H03F 1/02* (2006.01)
(Continued)

(52) U.S. Cl.
CPC ........... *H03F 1/0277* (2013.01); *H03F 1/025* (2013.01); *H03F 1/0227* (2013.01);
(Continued)

(58) Field of Classification Search
CPC ...... H03F 1/0277; H03F 1/0227; H03F 3/245; H03F 1/0261; H03F 3/45183;
(Continued)

(56) References Cited

U.S. PATENT DOCUMENTS 5,264,752 A 11/1993 Savicki
6,407,634 B1 6/2002 Staudinger et al.
(Continued)

FOREIGN PATENT DOCUMENTS

GB 2398648 8/2004
GB 2409115 11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Dhaval V Patel
(74) *Attorney, Agent, or Firm* — Knobbe, Martens, Olson & Bear, LLP

(57) ABSTRACT

Apparatus and methods for envelope tracking systems with automatic mode selection are provided herein. In certain configurations, a power amplifier system includes a power amplifier configured to provide amplification to a radio frequency signal and to receive power from a power amplifier supply voltage, and an envelope tracker including a signal bandwidth detection circuit configured to generate a detected bandwidth signal based on processing an envelope signal corresponding to an envelope of the radio frequency signal. The envelope tracker further includes a switch bank configured to receive a plurality of regulated voltages, a filter configured to filter an output of the switch bank to generate the power amplifier supply voltage, and a mode
(Continued)

control circuit configured to control a filtering characteristic of the filter based on the detected bandwidth signal.

20 Claims, 13 Drawing Sheets

Related U.S. Application Data continuation of application No. 16/136,573, filed on Sep. 20, 2018, now Pat. No. 10,454,428, which is a continuation of application No. 15/697,789, filed on Sep. 7, 2017, now Pat. No. 10,110,169.

(60) Provisional application No. 62/394,640, filed on Sep. 14, 2016.

(51) Int. Cl.
    *H03G 3/30*     (2006.01)
    *H03G 3/00*     (2006.01)
    *H03G 1/00*     (2006.01)
    *H03F 1/32*     (2006.01)
    *H03F 3/195*     (2006.01)
    *H03F 3/24*     (2006.01)
    *H03F 3/45*     (2006.01)

(52) U.S. Cl.
    CPC ......... *H03F 1/0261* (2013.01); *H03F 1/3247* (2013.01); *H03F 3/195* (2013.01); *H03F 3/245* (2013.01); *H03F 3/45183* (2013.01); *H03G 1/0029* (2013.01); *H03G 1/0088* (2013.01); *H03G 3/001* (2013.01); *H03G 3/3042* (2013.01); *H03F 2200/102* (2013.01); *H03F 2200/171* (2013.01); *H03F 2200/336* (2013.01); *H03F 2200/414* (2013.01); *H03F 2200/417* (2013.01); *H03F 2200/511* (2013.01); *H03F 2200/555* (2013.01)

(58) Field of Classification Search
    CPC ........ H03F 3/195; H03F 1/025; H03F 1/3247; H03F 2200/336; H03F 2200/511; H03F 2200/417; H03F 2200/414; H03F 2200/171; H03F 2200/102; H03F 2200/555; H03G 1/0088; H03G 3/3042; H03G 3/001; H03G 1/0029
    See application file for complete search history.

(56) References Cited

U.S. PATENT DOCUMENTS

| | | | |
|---|---|---|---|
| 6,583,664 B2 | 6/2003 | Mathe et al. | |
| 6,914,487 B1 | 7/2005 | Doyle et al. | |
| 7,482,869 B2 | 1/2009 | Wilson | |
| 8,094,764 B2 | 1/2012 | Lackey | |
| 8,587,377 B2 | 11/2013 | Khesbak et al. | |
| 8,803,605 B2 | 8/2014 | Fowers et al. | |
| 8,947,162 B2 | 2/2015 | Wimpenny et al. | |
| 9,065,385 B2 | 6/2015 | Gorbachov | |
| 9,066,368 B2 | 6/2015 | Lorenz et al. | |
| 9,445,371 B2 | 9/2016 | Khesbak et al. | |
| 9,667,196 B2 | 5/2017 | Midya | |
| 9,668,215 B2 | 5/2017 | Balteanu et al. | |
| 9,748,912 B2 | 8/2017 | Choi et al. | |
| 9,876,473 B2 | 1/2018 | Khesbak et al. | |
| 10,110,169 B2 * | 10/2018 | Khesbak | H03F 1/3247 |
| 10,454,428 B2 * | 10/2019 | Khesback | H03G 3/001 |
| 10,873,297 B2 * | 12/2020 | Khesbak | H03F 1/0261 |
| 2002/0030543 A1 | 3/2002 | French et al. | |
| 2002/0101912 A1 | 8/2002 | Phelts et al. | |
| 2003/0155978 A1 | 8/2003 | Pehlke | |
| 2004/0083409 A1 | 4/2004 | Rozenblit et al. | |
| 2004/0198271 A1 | 10/2004 | Kang | |
| 2005/0064830 A1 | 3/2005 | Grigore | |
| 2005/0070233 A1 | 3/2005 | Sowlati | |
| 2005/0110562 A1 | 5/2005 | Robinson et al. | |
| 2006/0119425 A1 | 6/2006 | Phillips et al. | |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2008/0238387 A1 | 10/2008 | Schmeller et al. | |
| 2009/0004981 A1 | 1/2009 | Eliezer et al. | |
| 2009/0016086 A1 | 1/2009 | Huynh et al. | |
| 2009/0097591 A1 | 4/2009 | Kim | |
| 2009/0128236 A1 | 5/2009 | Wilson | |
| 2009/0289720 A1 | 11/2009 | Takinami et al. | |
| 2009/0302941 A1 | 12/2009 | Wimpenny | |
| 2011/0058601 A1 | 3/2011 | Kim et al. | |
| 2012/0139641 A1 | 6/2012 | Kaczman et al. | |
| 2012/0146731 A1 | 6/2012 | Khesbak | |
| 2012/0200354 A1 | 8/2012 | Ripley et al. | |
| 2012/0201065 A1 | 8/2012 | Nate et al. | |
| 2012/0269240 A1 | 10/2012 | Balteanu et al. | |
| 2012/0326783 A1 | 12/2012 | Mathe et al. | |
| 2013/0034139 A1 | 2/2013 | Khlat et al. | |
| 2013/0109441 A1 | 5/2013 | Lorenz et al. | |
| 2013/0109442 A1 | 5/2013 | Dakshinamurthy et al. | |
| 2013/0116017 A1 | 5/2013 | Zhang et al. | |
| 2013/0127548 A1 | 5/2013 | Popplewell et al. | |
| 2013/0200864 A1 | 8/2013 | Huang et al. | |
| 2013/0207731 A1 | 8/2013 | Balteanu | |
| 2013/0217345 A1 | 8/2013 | Balteanu | |
| 2013/0231069 A1 | 9/2013 | Drogi | |
| 2013/0293210 A1 | 11/2013 | Smith et al. | |
| 2014/0002053 A1 * | 1/2014 | Wang | H02M 3/155 323/351 |
| 2014/0049321 A1 | 2/2014 | Gebeyehu et al. | |
| 2014/0213204 A1 | 7/2014 | Balteanu et al. | |
| 2014/0218109 A1 | 8/2014 | Wimpenny | |
| 2014/0240052 A1 | 8/2014 | Mao | |
| 2014/0300334 A1 | 10/2014 | Popplewell et al. | |
| 2014/0306763 A1 | 10/2014 | Hong et al. | |
| 2014/0312974 A1 | 10/2014 | Khesbak et al. | |
| 2014/0312977 A1 | 10/2014 | Kaczman et al. | |
| 2014/0361830 A1 | 12/2014 | Mathe et al. | |
| 2014/0361837 A1 * | 12/2014 | Strange | H03F 1/0238 330/297 |
| 2015/0009980 A1 | 1/2015 | Modi et al. | |
| 2015/0105033 A1 | 4/2015 | Modi et al. | |
| 2015/0155834 A1 | 6/2015 | Ripley et al. | |
| 2015/0180421 A1 | 6/2015 | Balteanu et al. | |
| 2015/0188432 A1 | 7/2015 | Vannorsdel et al. | |
| 2015/0236654 A1 | 8/2015 | Jiang et al. | |
| 2015/0270806 A1 | 9/2015 | Wagh et al. | |
| 2015/0326184 A1 | 11/2015 | Balteanu et al. | |
| 2015/0365053 A1 | 12/2015 | Wimpenny | |
| 2016/0006396 A1 | 1/2016 | Wimpenny | |
| 2016/0006397 A1 | 1/2016 | Wimpenny | |
| 2016/0036389 A1 | 2/2016 | Balteanu et al. | |
| 2016/0050629 A1 | 2/2016 | Khesbak et al. | |
| 2016/0094192 A1 | 3/2016 | Khesbak et al. | |
| 2016/0099742 A1 | 4/2016 | Ripley et al. | |
| 2016/0118943 A1 | 4/2016 | Khesbak | |
| 2016/0174153 A1 | 6/2016 | Balteanu et al. | |
| 2016/0261239 A1 | 9/2016 | Khesbak et al. | |
| 2016/0336901 A1 | 11/2016 | Khesbak et al. | |
| 2017/0005625 A1 | 1/2017 | Zhu et al. | |
| 2017/0047953 A1 | 2/2017 | Balteanu et al. | |
| 2017/0093347 A1 | 3/2017 | Zhu et al. | |
| 2017/0093505 A1 | 3/2017 | Ripley et al. | |
| 2017/0179889 A1 | 6/2017 | Khesbak et al. | |
| 2017/0195972 A1 | 7/2017 | Drogi et al. | |
| 2017/0223632 A1 | 8/2017 | Balteanu et al. | |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |

(56) References Cited

FOREIGN PATENT DOCUMENTS

| WO | WO 2009/127739 | 10/2009 |
|---|---|---|
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

\* cited by examiner

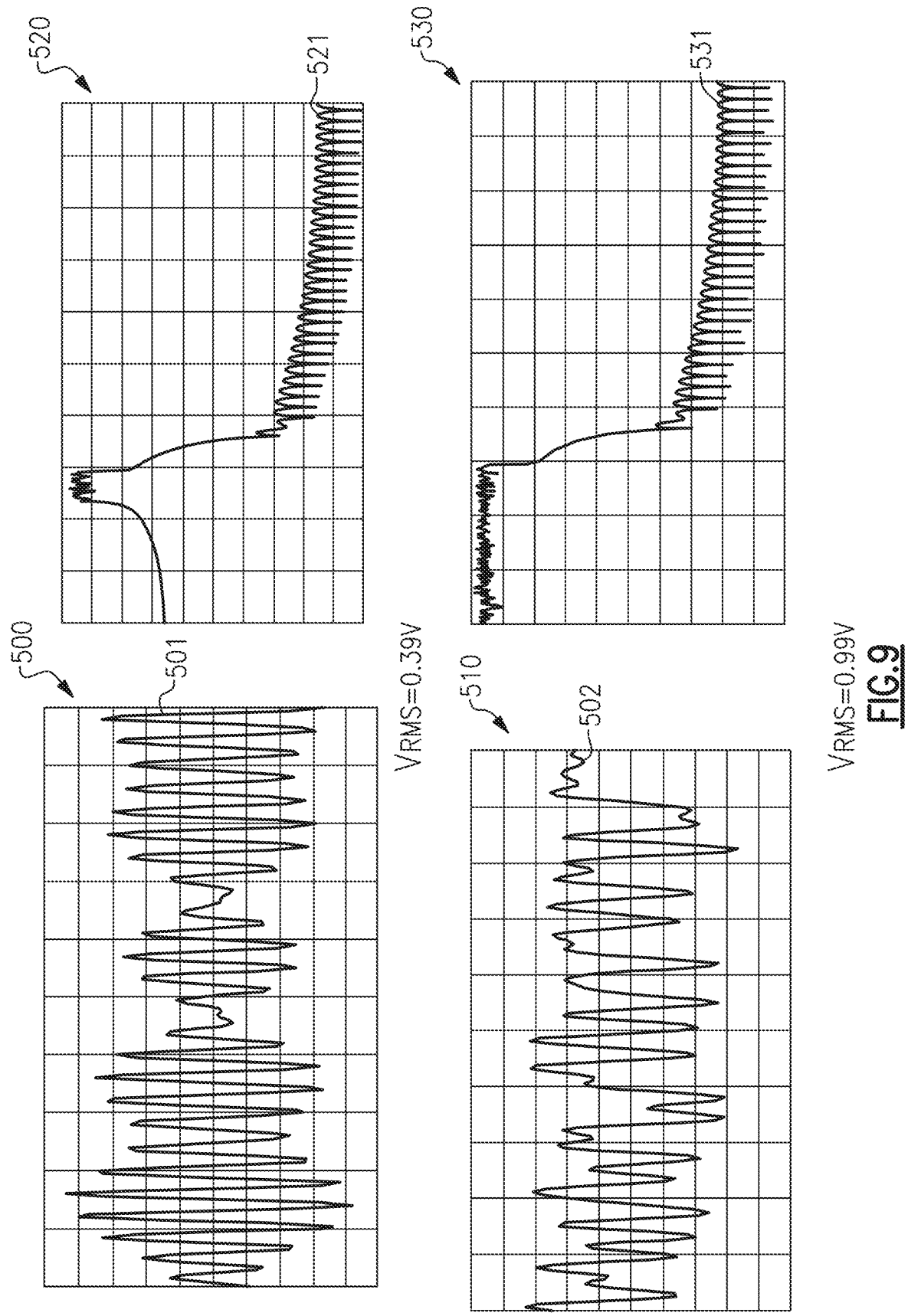

APPARATUS AND METHODS FOR ENVELOPE TRACKING SYSTEMS WITH AUTOMATIC MODE SELECTION

CROSS-REFERENCE TO RELATED APPLICATIONS

This application is a continuation of U.S. application Ser. No. 16/566,309, filed Sep. 10, 2019, and titled "APPARATUS AND METHODS FOR ENVELOPE TRACKING SYSTEMS WITH AUTOMATIC MODE SELECTION," which is a continuation of U.S. application Ser. No. 16/136,573, filed Sep. 20, 2018, and titled "APPARATUS AND METHODS FOR ENVELOPE TRACKING SYSTEMS WITH AUTOMATIC MODE SELECTION," which is a continuation of U.S. application Ser. No. 15/697,789, filed Sep. 7, 2017, and titled "APPARATUS AND METHODS FOR ENVELOPE TRACKING SYSTEMS WITH AUTOMATIC MODE SELECTION," which claims the benefit of priority under 35 U.S.C. § 119 of U.S. Provisional Patent Application No. 62/394,640, filed Sep. 14, 2016 and titled "APPARATUS AND METHODS FOR ENVELOPE TRACKING SYSTEMS WITH AUTOMATIC MODE SELECTION," which is herein incorporated by reference in its entirety.

BACKGROUND

Field

Embodiments of the invention relate to electronic systems, and in particular, to envelope tracking systems for radio frequency (RF) electronics.

Description of the Related Technology

Power amplifiers are used in radio frequency (RF) communication systems to amplify RF signals for transmission via antennas. It is important to manage the power of RF signal transmissions to prolong battery life and/or provide a suitable transmit power level.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY

In certain embodiments, the present disclosure relates to a power amplifier system. The power amplifier system includes a power amplifier configured to provide amplification to a radio frequency signal and to receive power from a power amplifier supply voltage, and an envelope tracker configured to generate the power amplifier supply voltage based on an envelope signal corresponding to an envelope of the radio frequency signal. The envelope tracker includes a signal bandwidth detection circuit configured to generate a detected bandwidth signal and a mode control circuit configured to control a mode of the envelope tracker based on the detected bandwidth signal.

In some embodiments, the signal bandwidth detection circuit includes a root mean square detector configured to generate a detection signal indicative of a root mean square value of the envelope signal. In various embodiments, the signal bandwidth detection circuit further includes an envelope bandwidth to voltage converter configured to generate the detected bandwidth signal based on the detection signal. In a number of embodiments, the envelope bandwidth to voltage converter includes a cascade of a plurality of converter cells, the detected bandwidth signal based on a sum of a plurality of currents generated by the plurality of converter cells.

According to several embodiments, the envelope tracker includes a DC-to-DC converter and an error amplifier. In various embodiments, the mode control circuit is configured to disable the error amplifier when the detected bandwidth signal indicates that a bandwidth of the radio frequency signal is less than a first threshold. In accordance with some embodiments, the envelope tracker and the DC-to-DC converter operate in parallel with one another to generate the power amplifier supply voltage when the detected bandwidth signal indicates that the bandwidth of the radio frequency signal is greater than a second threshold. In accordance with certain embodiments, the mode control circuit is further configured to decrease a bias current of the error amplifier when the detected bandwidth signal indicates that the bandwidth of the radio frequency signal is greater than the first threshold but less than the second threshold.

In some embodiments, the mode control circuit is configured to process the detected bandwidth signal to determine a number of resource blocks used by the radio frequency signal.

In a number of embodiments, the envelope tracker includes a multi-level switching circuit including a filter, the mode control circuit configured to control a filtering characteristic of the filter based on the detected bandwidth signal.

In certain embodiments, the present disclosure relates to a wireless device. The wireless device includes a transceiver configured to generate a radio frequency signal and an envelope signal corresponding to an envelope of the radio frequency signal, a power amplifier configured to provide amplification to the radio frequency signal and to receive power from a power amplifier supply voltage, and an envelope tracker configured to generate the power amplifier supply voltage based on the envelope signal. The envelope tracker includes a signal bandwidth detection circuit configured to generate a detected bandwidth signal and a mode control circuit configured to control a mode of the envelope tracker based on the detected bandwidth signal.

In some embodiments, the signal bandwidth detection circuit includes a root mean square detector configured to generate a detection signal indicative of a root mean square value of the envelope signal. In various embodiments, the signal bandwidth detection circuit further includes an envelope bandwidth to voltage converter configured to generate the detected bandwidth signal based on the detection signal. In a number of embodiments, the envelope bandwidth to voltage converter includes a cascade of a plurality of converter cells, the detected bandwidth signal based on a sum of a plurality of currents generated by the plurality of converter cells.

In several embodiments, the envelope tracker includes a DC-to-DC converter and an error amplifier. In accordance with a number of embodiments, the mode control circuit is configured to disable the error amplifier when the detected bandwidth signal indicates that a bandwidth of the radio frequency signal is less than a first threshold. According to certain embodiments, the envelope tracker and the DC-to-DC converter operate in parallel with one another to generate the power amplifier supply voltage when the detected bandwidth signal indicates that the bandwidth of the radio frequency signal is greater than a second threshold. In various embodiments, the mode control circuit is configured to decrease a bias current of the error amplifier when the detected bandwidth signal indicates that the bandwidth of the radio frequency signal is greater than the first threshold but less than the second threshold.

In some embodiments, the mode control circuit is configured to process the detected bandwidth signal to determine a number of resource blocks used by the radio frequency signal.

In several embodiments, the wireless device further includes a battery configured to provide a battery voltage to the envelope tracker.

In a number of embodiments, the wireless device further includes an antenna configured to receive an amplified radio frequency signal form the power amplifier.

According to several embodiments, the envelope tracker includes a multi-level switching circuit including a filter, the mode control circuit configured to control a filtering characteristic of the filter based on the detected bandwidth signal.

In certain embodiments, the present disclosure relates to a packaged module. The packaged module includes a package substrate, a power amplifier on the package substrate and configured to provide amplification to a radio frequency signal and to receive power from a power amplifier supply voltage, and an envelope tracker on the package substrate and configured to generate the power amplifier supply voltage based on an envelope signal corresponding to an envelope of the radio frequency signal. The envelope tracker includes a signal bandwidth detection circuit configured to generate a detected bandwidth signal and a mode control circuit configured to control a mode of the envelope tracker based on the detected signal bandwidth.

In certain embodiments, the present disclosure relates to a method of automatic mode control in an envelope tracking system. The method includes amplifying a radio frequency signal using a power amplifier, powering the power amplifier with a power amplifier supply voltage from an envelope tracker, detecting a signal bandwidth of the radio frequency signal based on processing an envelope signal using a signal bandwidth detection circuit of the envelope tracker, the envelope signal corresponding to an envelope of the radio frequency signal, and controlling a mode of the envelope tracker based on the detected signal bandwidth using a mode control circuit of the envelope tracker.

In some embodiments, the method further includes generating a detection signal indicative of a root mean square value of the envelope signal. In a number of embodiments, the method further includes converting the detection signal to voltage indicative of a number of resource blocks of the radio frequency signal.

In a number of embodiments, the method further includes disabling an error amplifier when the detected signal bandwidth is less than a first threshold. In several embodiments, the method further includes operating a DC-to-DC converter and the error amplifier in parallel with one another to generate the power amplifier supply voltage when the detected signal bandwidth is greater than a second threshold. In various embodiments, the method further includes decreasing a bias current of the error amplifier when the detected signal bandwidth is greater than the first threshold but less than the second threshold.

In several embodiments, the method further includes generating the radio frequency signal and the envelope signal using a transceiver.

In some embodiments, the method further includes controlling a filtering characteristic of a filter of the envelope tracker based on the detected bandwidth signal.

BRIEF DESCRIPTION OF THE DRAWINGS

FIG. 9 illustrates one example of lab generated data for an envelope tracking system.

DETAILED DESCRIPTION OF EMBODIMENTS

Figure 1:
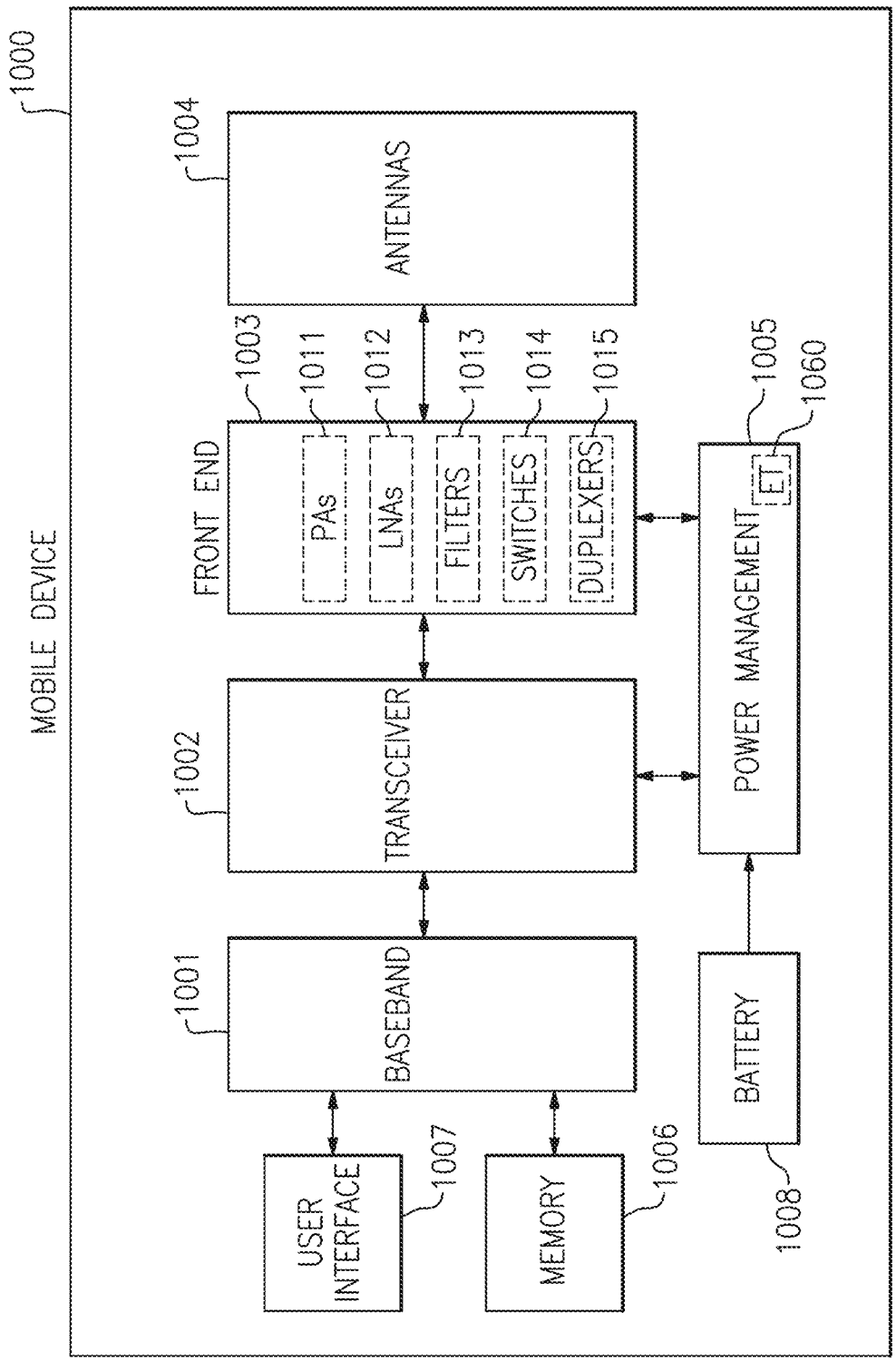
FIG. 1 is a schematic diagram of one example of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Overview of Examples of Radio Frequency Systems including an Envelope Tracker

FIG. 1 is a schematic diagram of one example of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 1 as the transceiver 1002. In one example, separate components (for instance, separate circuits or dies) can be provided for handling certain types of RF signals.

The front end system 1003 aids is conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 1, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 1 includes an envelope tracker 1060, which can be implemented in accordance with one or more features of the present disclosure. As shown in FIG. 1, the power management system 1005 receives a battery voltage form the battery 1008. The battery 1008 can be any suitable battery for use in the mobile device 1000, including, for example, a lithium-ion battery.

The mobile device 1000 of FIG. 1 illustrates one example of an RF system that can include an envelope tracking system implemented in accordance with one or more features of the present disclosure. However, the teachings herein are applicable to RF systems implemented in a wide variety of ways.

Figure 2:
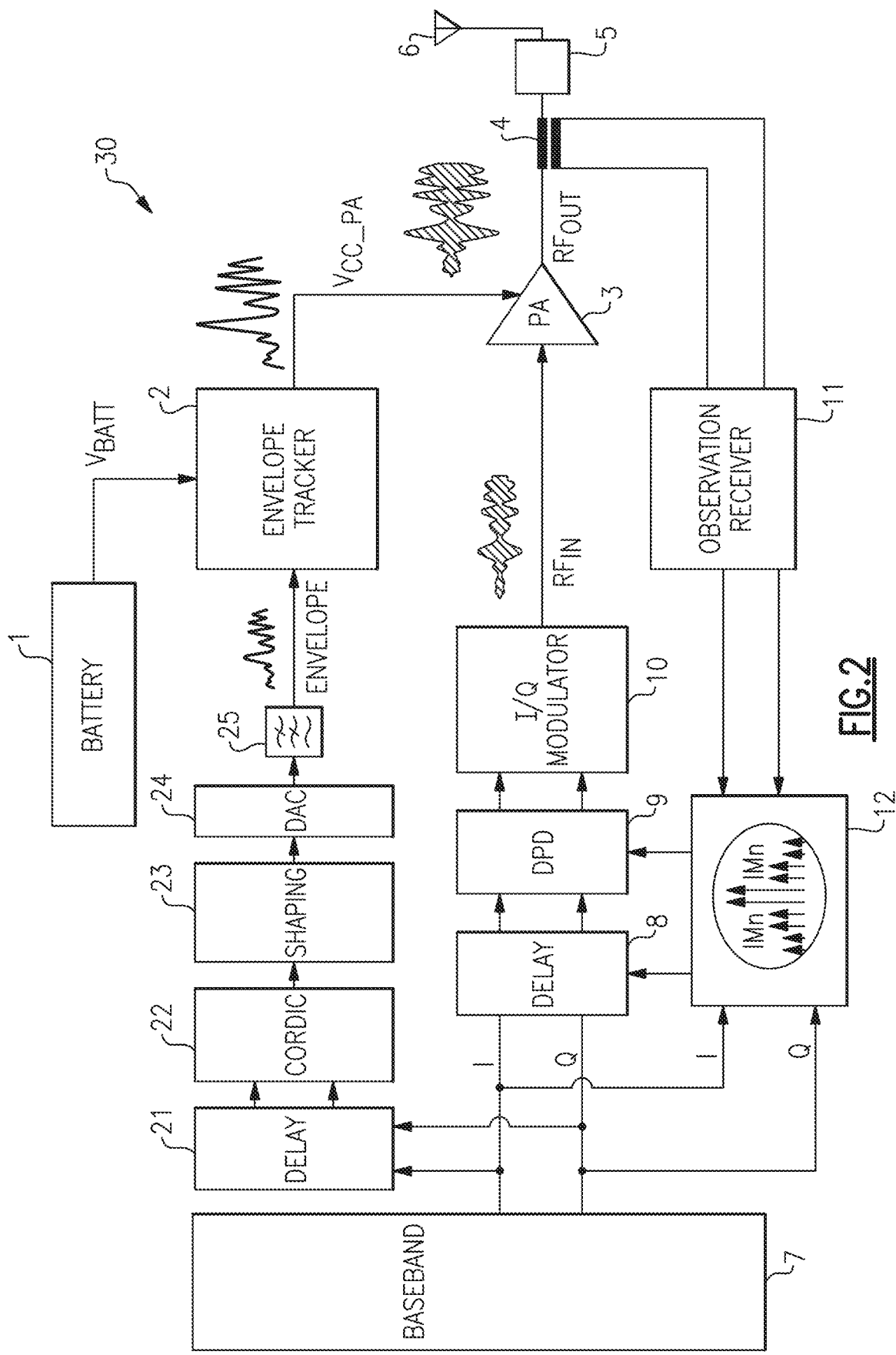
FIG. 2 is a schematic diagram of one example of a communication system for transmitting radio frequency (RF) signals.

FIG. 2 is a schematic diagram of one example of a communication system 30 for transmitting RF signals. The communication system 30 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The communication system 30 of FIG. 2 illustrates one example of an RF system that can include an envelope tracking system implemented in accordance with one or more features of the present disclosure. However, the teachings herein are applicable to RF systems implemented in a wide variety of ways.

The baseband processor 7 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 10 in a digital format. The baseband processor 7 can be any suitable processor configured to process a baseband signal. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal and the RF signal $RF_{IN}$. The amount of delay provided by the signal delay circuit 8 is controlled based on amount of intermodulation detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3.

The I/Q modulator 10 receives the digitally pre-distorted I and Q signals, which are processed to generate an RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal representing an envelope of the RF signal $RF_{IN}$. Although FIG. 2 illustrates an implementation using the CORDIC circuit 22, an envelope signal can be obtained in other ways.

The shaping circuit 23 operates to shape the digital envelope signal to enhance the performance of the communication system 30. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 2, the envelope tracker 2 receives the envelope signal from the reconstruction filter 25 and a battery voltage $V_{BATT}$ from the battery 1, and uses the envelope signal to generate a power amplifier supply voltage $V_{CC\_PPA}$ for the power amplifier 3 that changes in relation to the envelope of the RF signal $RF_{IN}$. The power amplifier 3 receives the RF signal $RF_{IN}$ from the I/Q modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for down converting I and Q signal components of the sensed output signal, and DACs for generating I and Q observation signals from the downconverted signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$.

By including a feedback path from the output of the power amplifier 3 and baseband, the I and Q signals can be dynamically adjusted to optimize the operation of the communication system 30. For example, configuring the communication system 30 in this manner can aid in providing power control, compensating for transmitter impairments, and/or in performing DPD.

Although illustrated as a single stage, the power amplifier 3 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 3:
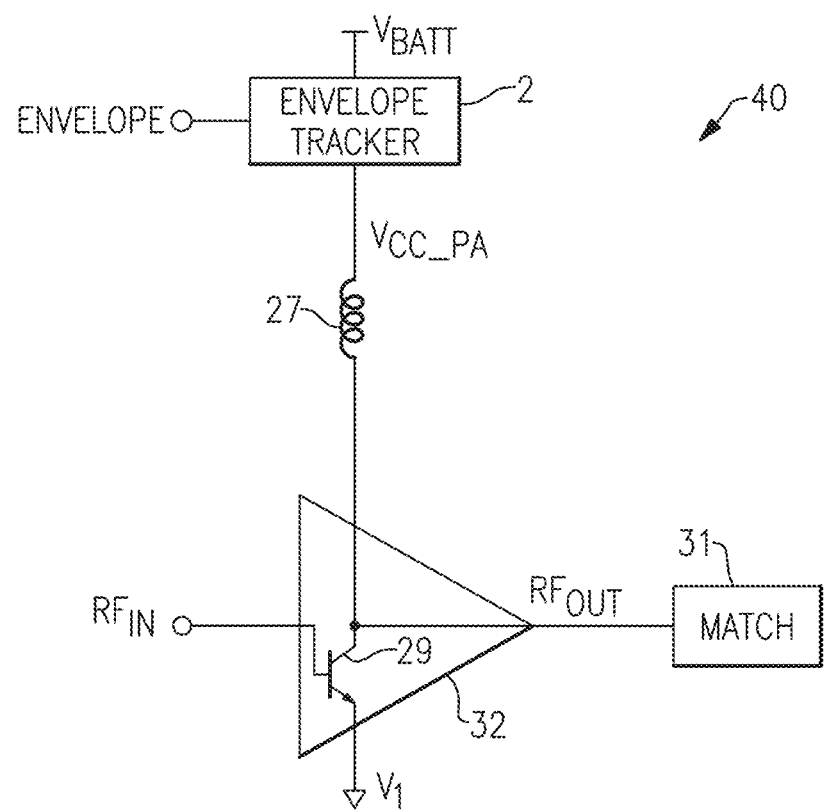
FIG. 3 is a schematic diagram of one example of a power amplifier system including an envelope tracker.

FIG. 3 is a schematic diagram of one example of a power amplifier system 40 including an envelope tracker 2. The illustrated power amplifier system 40 further includes an inductor 27, an impedance matching circuit 31, and a power amplifier 32. The illustrated envelope tracker 2 is configured to receive an envelope of the RF signal and to generate a power amplifier supply voltage $V_{CC\_PPA}$ for the power amplifier 32 using a battery voltage $V_{BATT}$.

The illustrated power amplifier 32 includes a bipolar transistor 29 having an emitter, a base, and a collector. As shown in FIG. 3, the emitter of the bipolar transistor 29 is electrically connected to a power low supply voltage $V_1$, which can be, for example, a ground supply. Additionally, an RF signal ($RF_{IN}$) is provided to the base of the bipolar transistor 29, and the bipolar transistor 29 amplifies the RF signal to generate an amplified RF signal at the collector. The bipolar transistor 29 can be any suitable device. In one implementation, the bipolar transistor 29 is a heterojunction bipolar transistor (HBT).

The impedance matching circuit 31 serves to terminate the output of the power amplifier 32, which can aid in increasing power transfer and/or reducing reflections of the amplified RF signal generated by the power amplifier 32. In certain implementations, the impedance matching circuit 31 further operates to provide harmonic termination.

The inductor 27 can be included to power the power amplifier 32 with the power amplifier supply voltage $V_{CC\_PA}$ generated by the envelope tracker 2 while choking or blocking high frequency RF signal components. The inductor 27 can include a first end electrically connected to the envelope tracker 2, and a second end electrically connected to the collector of the bipolar transistor 29. In certain implementations, the inductor 27 operates in combination with the impedance matching circuit 31 to provide output matching.

Although FIG. 3 illustrates one implementation of the power amplifier 32, skilled artisans will appreciate that the teachings described herein can be applied to a variety of power amplifier structures, such as multi-stage power amplifiers and power amplifiers employing other transistor structures. For example, in some implementations the bipolar transistor 29 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 32 can be adapted to include additional circuitry, such as biasing circuitry.

Figure 4A:
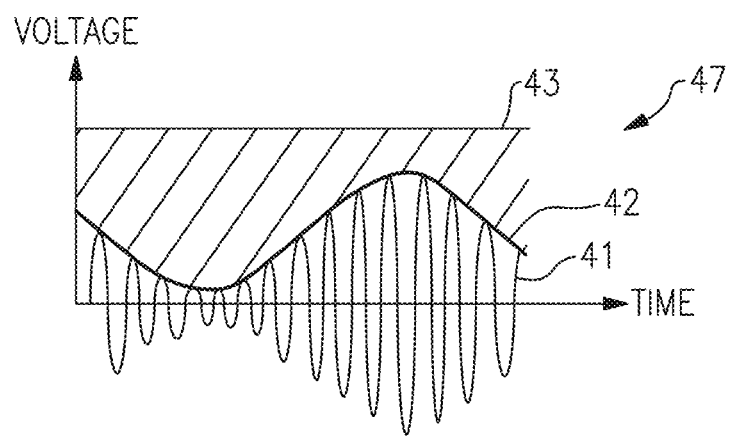
FIGS. 4A-4B show two examples of power amplifier supply voltage versus time.
Figure 4B:
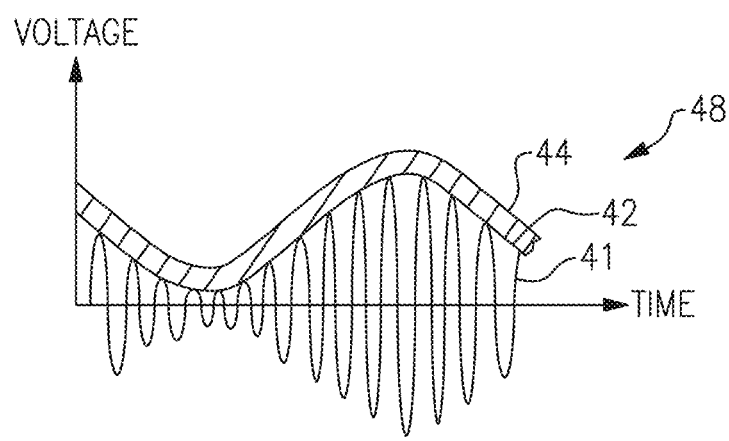

FIGS. 4A-4B show two examples of power amplifier supply voltage versus time.

In FIG. 4A, a graph 47 illustrates one example of the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or other problems. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

In FIG. 4B, a graph 48 illustrates another example of the voltage of an RF signal 41 and a power amplifier supply voltage 44 versus time. In contrast to the power amplifier supply voltage 43 of FIG. 4A, the power amplifier supply voltage 44 of FIG. 4B changes in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Overview of Examples of Envelope Tracking Systems with Automatic Mode Selection

Envelope tracking is a technique that can be used to increase power added efficiency (PAE) of a power amplifier system by efficiently controlling a voltage level of a power amplifier supply voltage in relation to an envelope of the RF signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

In one example, an envelope tracker includes a DC-to-DC converter that operates in combination with an error amplifier to generate a power amplifier supply voltage based on an envelope signal. For example, the DC-to-DC converter and the error amplifier can be electrically connected in parallel with one another, and the DC-to-DC converter can track low frequency components of the envelope signal while the error amplifier can track high frequency components of the envelope signal. For example, the DC-to-DC converter's switching frequency can be reduced to be less than a maximum frequency component of the envelope signal, and the error amplifier can operate to smooth gaps in the converter's output to generate the power amplifier supply voltage. In certain implementations, the DC-to-DC converter and error amplifier are combined via a combiner.

In another example, an envelope tracker includes a multi-output boost switcher for generating regulated voltages of different voltage levels, a bank of switches for controlling selection of a suitable regulated voltage over time based on the envelope signal, and a filter for filtering the output of the switch bank to generate the power amplifier supply voltage.

Apparatus and methods for envelope tracking systems with automatic mode selection are provided herein. In certain configurations, a power amplifier system includes a power amplifier that amplifies a radio frequency signal and that receives power from a power amplifier supply voltage. The power amplifier system further includes an envelope tracker that generates the power amplifier supply voltage based on an envelope signal corresponding to an envelope of the radio frequency signal. The envelope tracker further includes a signal bandwidth detection circuit that processes the envelope signal to generate a detected bandwidth signal, and a mode control circuit that controls a mode of the envelope tracker based on the detected bandwidth signal.

By controlling a mode of the envelope tracker based on the detected signal bandwidth, an overall efficiency of the envelope tracker can be increased. In certain implementations, an RF signal includes signal content corresponding to one or more resource blocks (RB), and the mode of the envelope tracker is selected based on the number of detected resource blocks.

In one embodiment, the envelope tracker includes a multi-output boost switcher for generating regulated voltages of different voltage levels, switches for controlling selection of a suitable regulated voltage based on the envelope signal, and a filter for filtering the output of the switches to generate the power amplifier supply voltage. Additionally, a filtering characteristic of the filter is controlled based on the detected signal bandwidth.

In another embodiment, the envelope tracker includes a DC-to-DC converter that operates in combination with an error amplifier to generate a power amplifier supply voltage based on an envelope signal. Additionally, the error amplifier is controlled based on the detected signal bandwidth.

In one example, when the detected signal bandwidth is low (for instance, relatively few resource blocks are used), the error amplifier is disabled to increase power efficiency. In another example, when the detected signal bandwidth is intermediate (for instance, a moderate number of resource blocks are used), the error amplifier bias current is reduced to conserve power. In a third example, when the detected signal bandwidth is relatively high (for instance, a large number of resource blocks are used), the error amplifier and the DC-to-DC converter operate in parallel to generate the power amplifier supply voltage.

Thus, in certain implementations an error amplifier can be disabled and/or a bias of an error amplifier can be controlled to reduce power consumption when the detected signal bandwidth is less than a maximum.

Figure 5A:
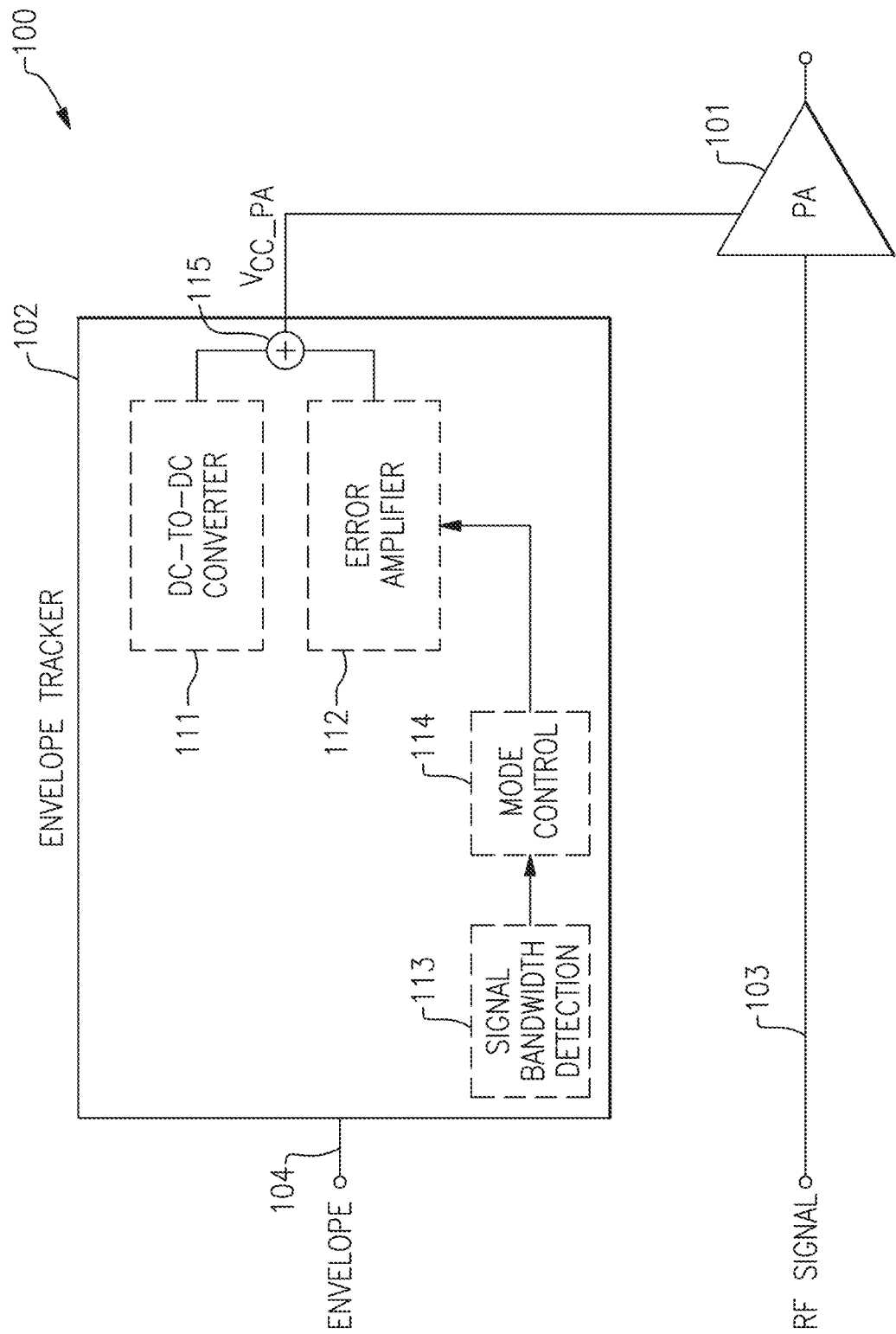
FIG. 5A is a schematic diagram of a power amplifier system according to one embodiment.

FIG. 5A is a schematic diagram of a power amplifier system 100 according to one embodiment. The power amplifier system 100 includes a power amplifier 101 and an envelope tracker 102. The power amplifier 101 provides amplification to a radio frequency signal 103.

The envelope tracker 102 of FIG. 5A illustrates one embodiment of an envelope tracker that operates with automatic mode selection. However, the teachings herein are applicable to envelope trackers implemented in a wide variety of ways. Accordingly, other implementations are possible.

The envelope tracker 102 receives an envelope signal 104 corresponding to an envelope of the radio frequency signal 103. Additionally, the envelope tracker 102 generates a power amplifier supply voltage $V_{CC\_PA}$, which supplies power to the power amplifier 101.

The illustrated envelope tracker 102 includes a DC-to-DC converter 111 and an error amplifier 112 that operate in combination with one another to generate the power amplifier supply voltage $V_{CC\_PA}$ based on the envelope signal 104. In the illustrated embodiment, an output of the DC-to-DC converter 111 and an output of the error amplifier 112 are combined using a combiner 115. The envelope tracker 102 further includes a signal bandwidth detection circuit 113 that processes the envelope signal 104 to detect a signal bandwidth of the radio frequency signal 103. Additionally, the envelope tracker 102 includes the mode control circuit 114, which processes the detected signal bandwidth to control a mode of the error amplifier 112.

In one embodiment, the signal bandwidth detection circuit 113 detects the signal bandwidth of the radio frequency signal 103 based on determining a number of resource blocks (RBs) used by the radio frequency signal 103. However, other implementations are possible.

The mode selection circuit 114 controls a mode of the envelope tracker 102 to one of multiple different modes. The modes are suitable for processing envelope signals of different bandwidths. Thus, the envelope tracker 102 can be operated in a mode that is power efficient with respect to a given signal bandwidth.

In certain configurations, the mode control circuit 114 disables the error amplifier 112 when the detected signal bandwidth is less than a first threshold. Thus, when the detected signal bandwidth is relatively low, the DC-to-DC converter 111 generates the power amplifier supply voltage $V_{CC\_PA}$.

Disabling the error amplifier 112 when the detected signal bandwidth is relatively low increases power efficiency, since the DC-to-DC converter 111 tracks low frequency components of the envelope signal 104 with greater efficiency relative to the error amplifier 112.

However, when the detected signal bandwidth is relatively high, such as when the detected signal bandwidth is greater than a second threshold, the DC-to-DC converter 111 and the error amplifier 112 can operate in parallel with one another to control the power amplifier supply voltage $V_{CC\_PA}$. The combination of the DC-to-DC converter 111 and the error amplifier 112 can provide envelope tracking of wide bandwidth envelope signals, since the DC-to-DC converter 111 can provide superior tracking of low frequency components of the envelope signal 104 while the error amplifier 112 can provide superior tracking of high frequency components of the envelope signal 104.

In one embodiment, the mode control circuit 114 decreases a bias current of the error amplifier 112 when the detected signal bandwidth is greater that the first threshold but less than the second threshold. For example, the mode control circuit 114 can include one or more intermediate power modes used to generate the power amplifier supply voltage $V_{CC\_PA}$ with higher efficiency while operating the error amplifier 112 at a backed-off power level appropriate for a given signal bandwidth.

Figure 5B:
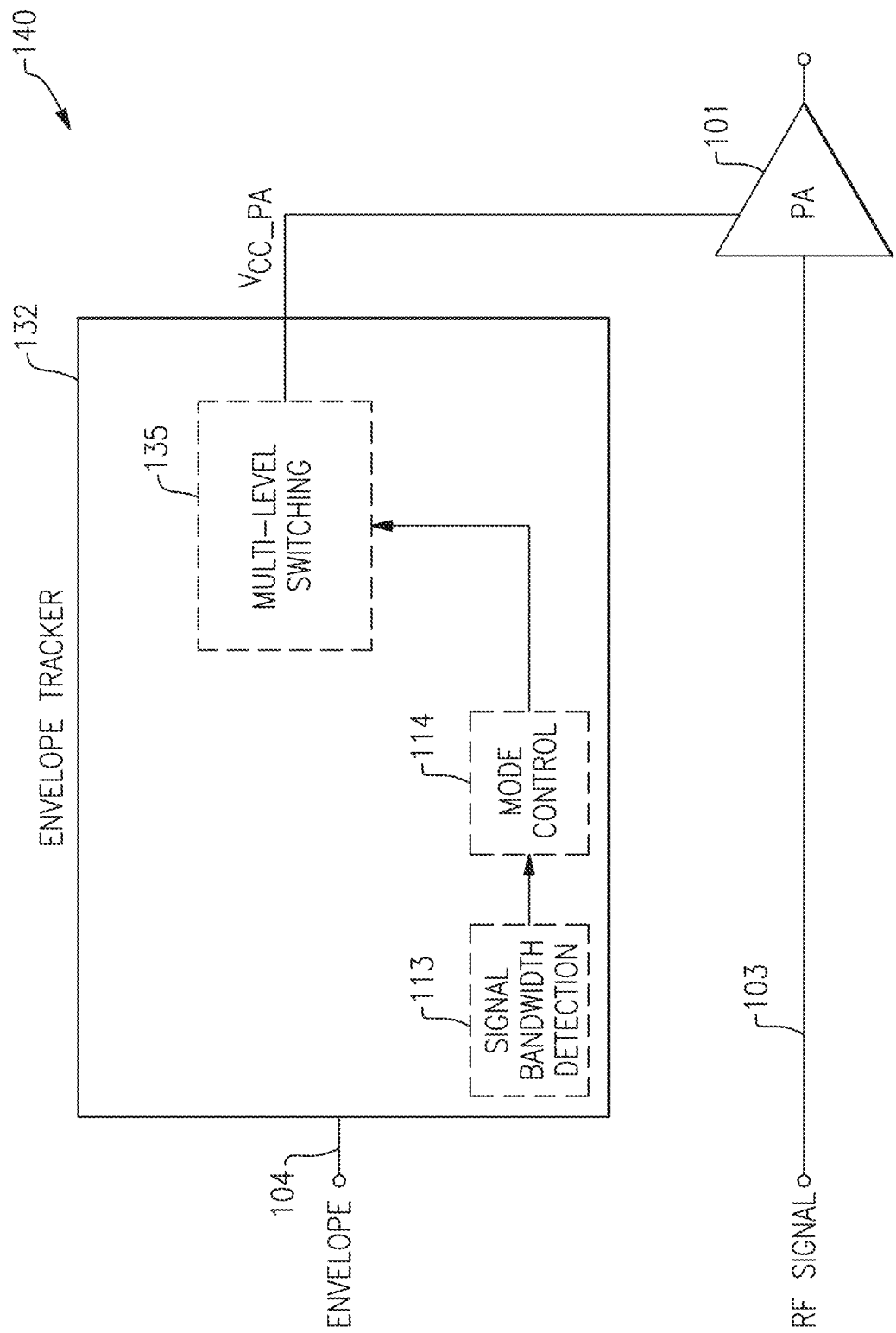
FIG. 5B is a schematic diagram of a power amplifier system according to another embodiment.

FIG. 5B is a schematic diagram of a power amplifier system 140 according to another embodiment. The power amplifier system 140 includes a power amplifier 101 and an envelope tracker 132. The power amplifier 101 provides amplification to a radio frequency signal 103.

The envelope tracker 132 of FIG. 5B illustrates another embodiment of an envelope tracker that operates with automatic mode selection. However, the teachings herein are applicable to envelope trackers implemented in a wide variety of ways. Accordingly, other implementations are possible.

The envelope tracker 132 receives an envelope signal 104 corresponding to an envelope of the radio frequency signal 103. Additionally, the envelope tracker 132 generates a power amplifier supply voltage $V_{CC\_PA}$, which supplies power to the power amplifier 101.

The illustrated envelope tracker 132 includes a signal bandwidth detection circuit 113, a mode control circuit 114, and a multi-level switching circuit 135. The bandwidth detection circuit 113 processes the envelope signal 104 to detect a signal bandwidth of the radio frequency signal 103. In one example, the signal bandwidth detection circuit 113 detects the signal bandwidth of the radio frequency signal 103 based on determining a number of RBs used by the radio frequency signal 103. Furthermore, the mode control circuit 114 processes the detected signal bandwidth to control a mode of the multi-level switching circuit 135.

The mode selection circuit 114 controls a mode of the multi-level switching circuit 135 to one of multiple different modes. The modes are suitable for processing envelope signals of different bandwidths. Thus, the envelope tracker 132 can be operated in a mode that is power efficient with respect to a given signal bandwidth.

In certain implementations, the multi-level switching circuit includes a multi-output DC-to-DC converter for generating regulated voltages of different voltage levels, switches for controlling selection of a suitable regulated voltage over time based on the envelope signal, and a filter for filtering the output of the switches to generate the power amplifier supply voltage. Additionally, a filtering characteristic of the filter, such as filter bandwidth and/or cutoff frequency, is controlled by the mode selection circuit 114 based on the mode.

Figure 6:
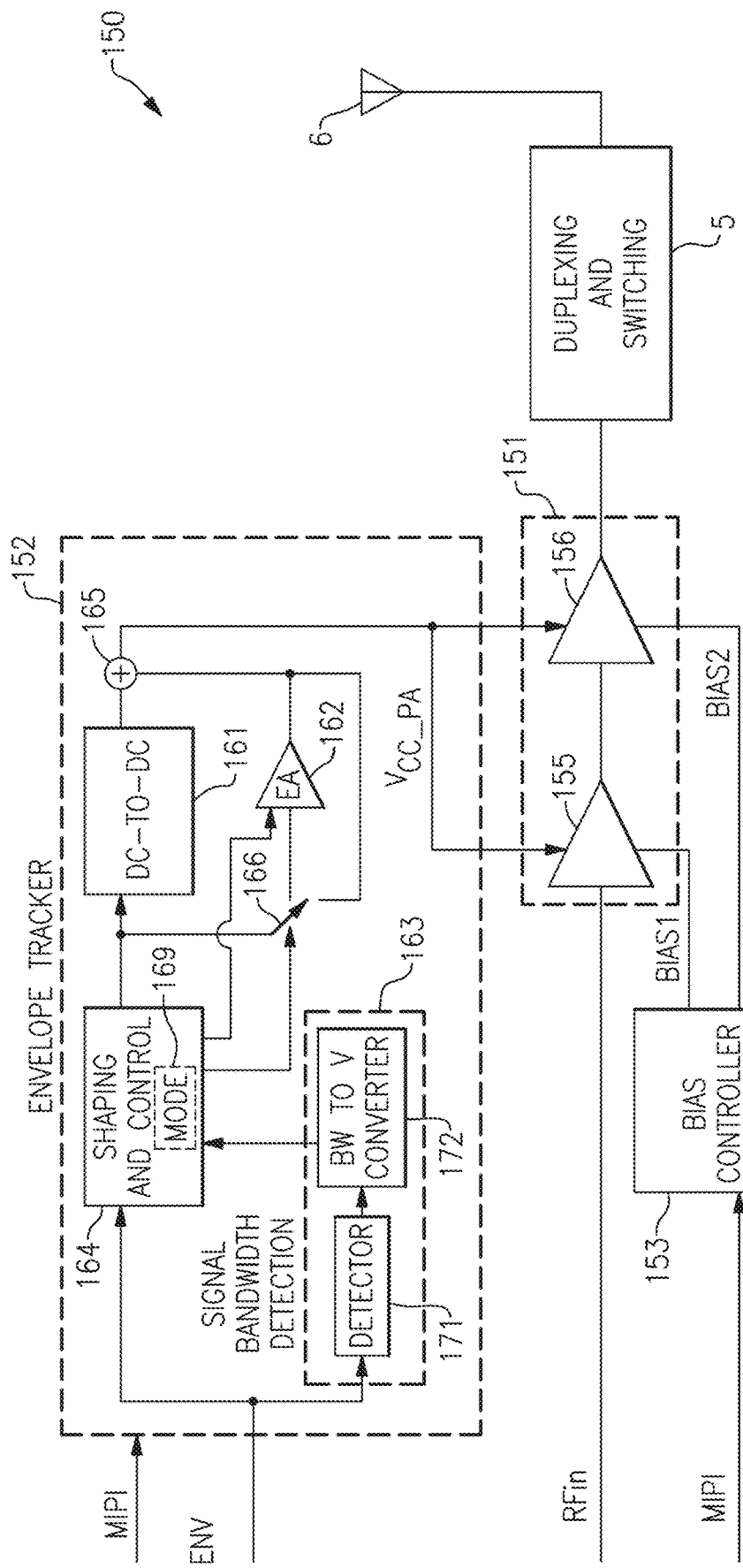
FIG. 6 is a schematic diagram of a power amplifier system according to another embodiment.

FIG. 6 is a schematic diagram of a power amplifier system 150 according to another embodiment. The power amplifier system 150 includes a duplexing and switching circuit 5, an antenna 6, a power amplifier 151, an envelope tracker 152, and a bias controller 153.

The power amplifier 151 provides amplification to a radio frequency signal RFin, and provides an amplified radio frequency signal to the antenna 6 via the duplexing and switching circuit 5. In the illustrated embodiment, the power amplifier 151 includes a first stage 155 and a second stage 156, which are in a cascade. Thus, the power amplifier 151 is a multi-stage power amplifier, in this embodiment.

The bias controller 153 generates a first bias signal BIAS1 for the first stage 155 of the power amplifier 151, and a second bias signal BIAS2 for the second stage 156 of the power amplifier 151. The first bias signal BIAS1 and the second bias signal BIAS2 can include a bias current, a bias voltage, or a combination thereof. In certain configurations, the bias controller 153 is implemented using a manufacturing technology suitable for fabricating metal oxide semiconductor (MOS) transistors, such as a complementary metal oxide semiconductor (CMOS) process.

The illustrated envelope tracker 152 includes a DC-to-DC converter 161, a linear or error amplifier 162, a signal bandwidth detection circuit 163, a shaping and control circuit 164, a combiner 165, and a mode switch 166. In the illustrated embodiment, an output of the DC-to-DC converter 161 and an output of the error amplifier 162 are combined using the combiner 165.

As shown in FIG. 6, the power amplifier supply voltage $V_{CC\_PA}$ is controlled based on an output of the DC-to-DC converter 161 and on an output of the error amplifier 162.

The shaping and control circuit 164 receives the envelope signal ENV, and processes the envelope signal ENV to generate a shaped envelope signal and/or control signals suitable for controlling the DC-to-DC converter 161 and the error amplifier 162.

The illustrated signal bandwidth detection circuit 163 includes a root mean square (RMS) detector 171 and an envelope bandwidth to voltage converter 172. The RMS detector 171 generates a detection signal indicative of an RMS value of the envelope signal ENV. Additionally, the envelope bandwidth to voltage converter 172 processes the detection signal to generate an output voltage that changes based on the signal bandwidth detected by processing the envelope signal ENV.

As shown in FIG. 6, the signal bandwidth detection circuit 163 provides the detected bandwidth signal to a mode control circuit 169 of the shaping and control circuit 164. The mode control circuit 169 processes the detected bandwidth signal to select an operating mode of the envelope tracker 152. According, the illustrated embodiment includes a mode control circuit integrated in a shaping and control circuit 164 used to provide envelope shaping and control over a DC-to-DC converter and error amplifier. However, other implementations are possible.

In another embodiment, the signal bandwidth detection circuit 163 provides a detected bandwidth signal to a mode control circuit that controls a mode of a multi-level switching circuit. Additionally, a filtering characteristic of the multi-level switching circuit is changed by the mode control circuit based on the detected signal bandwidth. Thus, the filtering characteristic of the multi-level switching circuit, such as filter bandwidth and/or cutoff frequency, changes with the selected mode.

In the illustrated embodiment, the mode control circuit 169 controls a state of the mode switch 166 based on the detected signal bandwidth determined by the signal bandwidth detection circuit 163.

When the detected signal bandwidth is relatively low, such as when the radio frequency signal RFin includes signal components of a relatively small number of resource blocks, the shaping and control circuit 169 disables the error amplifier 162 via the mode switch 166.

In certain implementations, the mode control circuit 169 disables the error amplifier 162 using the mode switch 166 when the detected number of resource blocks is less than a first amount. Thus, when the detected number of resource blocks is relatively low, the DC-to-DC converter 161 generates the power amplifier supply voltage $V_{CC\_PA}$.

However, when the detected signal envelope bandwidth is relatively high, such as when the detected number of resource blocks is greater than a second amount, the DC-to-DC converter 161 and the error amplifier 162 can operate in parallel with one another to control the power amplifier supply voltage $V_{CC\_PA}$.

The mode control circuit 169 can also be used to control a bias of the error amplifier 162.

In one embodiment, the mode control circuit 169 decreases a bias current of the error amplifier 162 when the detected number of resource blocks is greater that the first amount but less than the second amount. For example, the mode control circuit 169 can include one or more intermediate power modes used to generate the power amplifier supply voltage $V_{CC\_PPA}$ with higher efficiency while operating the error amplifier 162 at a backed-off power level appropriate for a given number of resource blocks being used by the radio frequency signal RFin.

In the illustrated embodiment, the power amplifier 151 communicates via a serial interface, such as a Mobile Industry Processor Interface (MIPI) interface. For example, the serial interface can be used to control biasing of the power amplifier 151. In certain configurations, the serial interface is used to provide data to the envelope tracker, such as data identifying operating mode, operating band, and/or characteristics of the radio frequency signal RFin.

Figure 7:
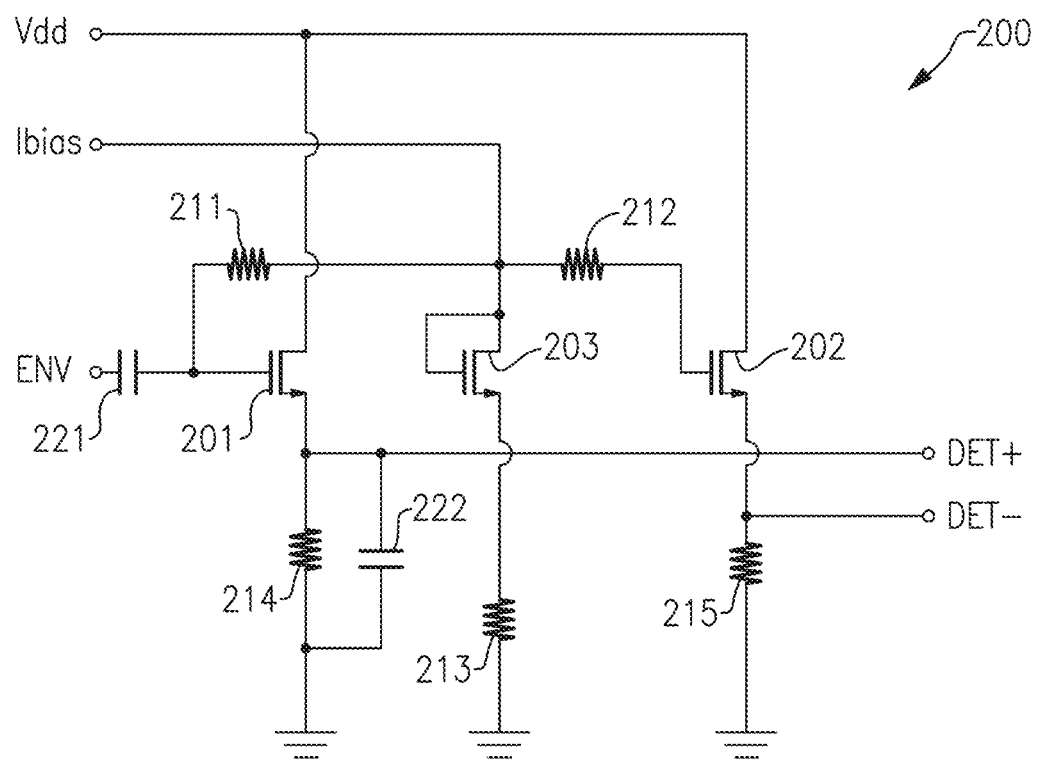
FIG. 7 is a schematic diagram of a root mean square detector according to one embodiment.

FIG. 7 is a schematic diagram of a root mean square (RMS) detector 200 according to one embodiment.

The RMS detector 200 of FIG. 7 illustrates one implementation of the RMS detector 171 of FIG. 6. However, the teachings herein are applicable signal bandwidth detection circuits implemented in a wide variety of ways. Accordingly, other implementations are possible.

With continuing reference to FIG. 7, the RMS detector 200 receives an envelope signal ENV, and processes the envelope signal to generate a differential detection signal corresponding to a difference between a non-inverted detection signal DET+ and an inverted detection signal DET−.

The RMS detector 200 includes a first detection n-type field effect transistor (NFET) 201, a second detection NFET 202, a bias NFET 203, a first biasing resistor 211, a second biasing resistor 212, a third biasing resistor 213, a first detection resistor 214, a second detection resistor 215, an input capacitor 221, and a filter capacitor 222.

The input capacitor 221 couples the envelope signal ENV to a gate of the first detection NFET 201 while providing DC voltage blocking. The first biasing resistor 211 and the second biasing resistor 212 control the DC bias voltages of the first detection NFET 201 and the second detection NFET 202, respectively. The DC bias voltage level is based on a magnitude of a bias current provided through the bias NFET 203 and the third bias resistor 213.

The current through the first detection NFET 203 and the first detection resistor 214 changes in relation to the envelope signal ENV. Additionally, the filter capacitor 222 operates to filter the voltage across the first detection resistor 214. Thus, the non-inverted detection signal DET+ changes with the envelope signal ENV. The non-inverted detection signal DET+ also includes a DC component that is based on DC biasing, including for example, a magnitude of the bias current Ibias. To compensate for DC biasing, the second detection NFET 202 and the second detection resistor 215 are used to generate the inverted detection signal DET−, which has a DC component that tracks the DC component of the non-inverted detection signal.

By using differential signaling, a detection signal that changes with an RMS value of the envelope signal ENV is provided, while compensating or correction for a DC bias offset or error.

Figure 8A:
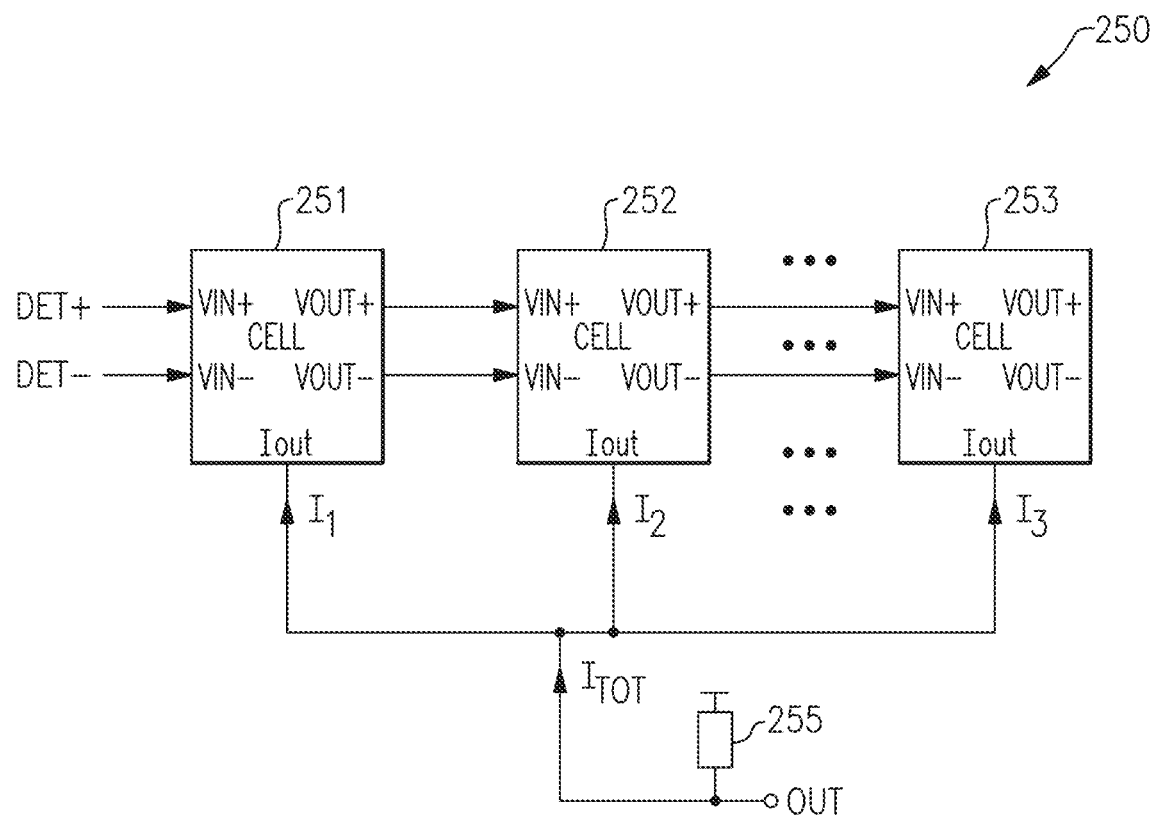
FIG. 8A is a schematic diagram of an envelope bandwidth to voltage converter according to one embodiment.

FIG. 8A is a schematic diagram of an envelope bandwidth to voltage converter 250 according to one embodiment.

The RMS detector 250 of FIG. 8A illustrates one implementation of the envelope bandwidth to voltage converter 172 of FIG. 6. However, the teachings herein are applicable signal bandwidth detection circuits implemented in a wide variety of ways. Accordingly, other implementations are possible.

The envelope bandwidth to voltage converter 250 is used to generate an output voltage OUT, which changes in relation to a bandwidth indicated by an input differential detection signal corresponding to a difference between a non-inverted RMS detection signal DET+ and an inverted RMS detection signal DET−.

The voltage converter 250 includes a first converter cell 251, a second converter cell 252, and a third converter cell 253 arranged in a cascade. Although the illustrated embodiment includes three converter cells, more or fewer converter cells can be included.

As shown in FIG. 8A, the first converter cell 251 generates a first current $I_1$ based on the input differential detection signal DET+, DET−. Additionally, the first converter cell 251 provides a first down-shifted detection signal to the second converter cell 252 based on down-shifting the voltage of the input detection signal DET+, DET−. The second converter cell 252 generates a second current $I_2$ based on the first down-shifted differential detection signal. The second converter cell 252 further provides a second down-shifted detection signal to the third converter cell 253 based on down-shifting the voltage of the first output detection signal. Furthermore, the third converter cell 253 generates a third current $I_3$ based on the second down-shifted detection signal. As shown in FIG. 8A, in the illustrated embodiment, the converter cells each include non-inverted input voltage VIN+, inverted input voltage VIN−, non-inverted output voltage VOUT+, inverted output voltage VOUT−, and output current Iout terminals.

As shown in FIG. 8A, the currents from the converter cells 251-253 are summed to generate a total current $I_{TOT}$, which flows through the impedance 255 to generate the output signal OUT. In certain implementations, the impedance 255 is connected to a positive reference voltage, such as a power high supply voltage.

Figure 8B:
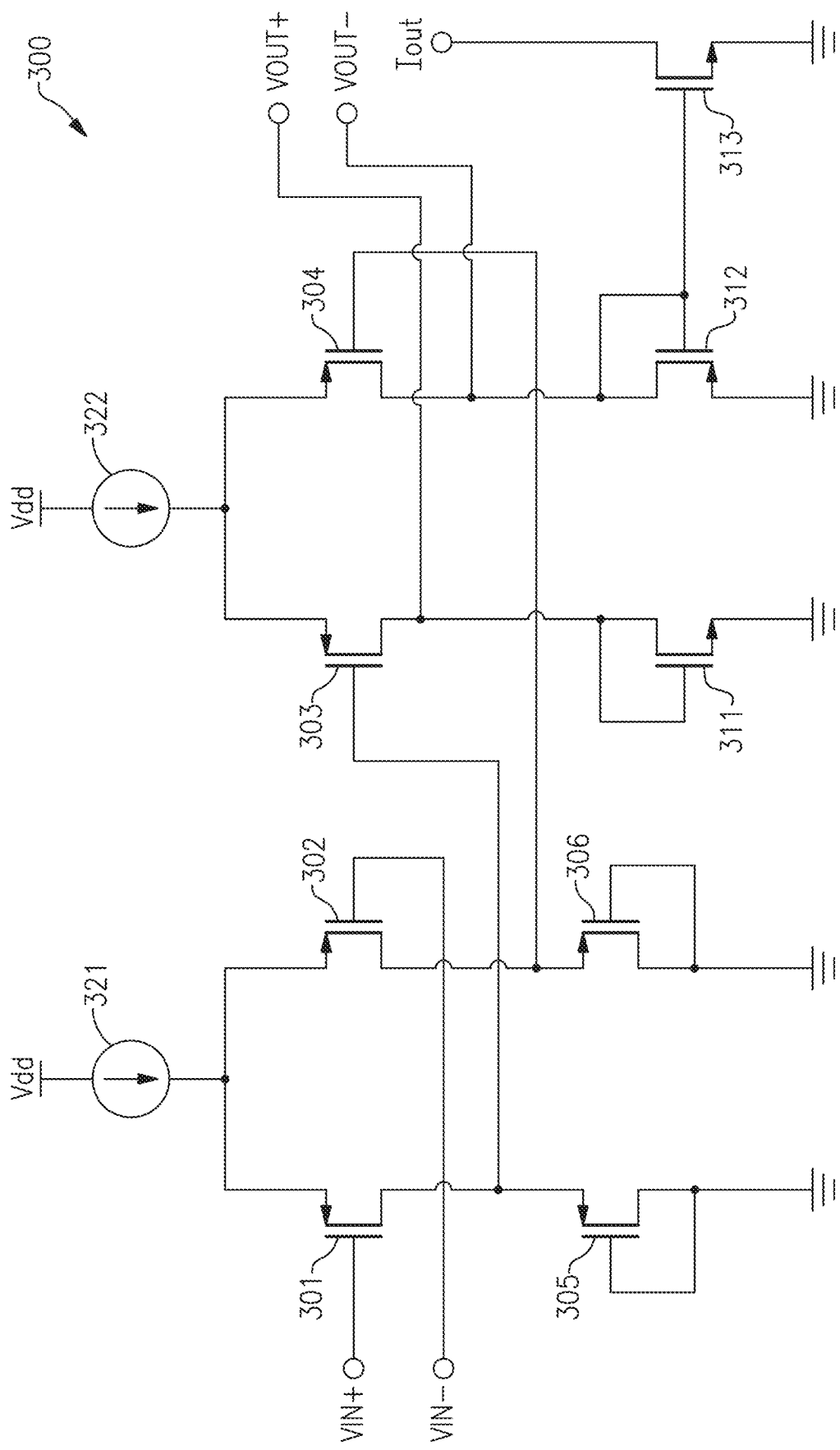
FIG. 8B is a schematic diagram of one embodiment of a converter cell for the envelope bandwidth to voltage converter of FIG. 8A.

FIG. 8B is a schematic diagram of one embodiment of a converter cell 300 for the envelope bandwidth to voltage converter 250 of FIG. 8A.

The converter cell 300 includes a first differential transistor pair including a first p-type field effect transistor (PFET) 301 and a second PFET 302, and a second differential transistor pair including a third PFET 303 and a fourth PFET 304. The converter cell 300 further includes a first load transistor pair including a fifth PFET 305 and a sixth PFET 306, and a second load transistor pair including a first NFET 311 and a second NFET 312. As shown in FIG. 8B, the first load transistor pair serves as a load to the first differential transistor pair, and the second load transistor pair serves as a load to the second differential transistor pair.

The first differential transistor pair 301-302 amplifies a voltage difference between the differential input signal IN+, IN−. Additionally, the amplified voltage difference provided by the first differential transistor pair 301-302 is further amplified by the second differential transistor pair 303-304 to generate a differential output signal VOUT+, VOUT−.

The current through the second NFET 312 is mirrored using the mirror NFET 313 to generate an output current Iout for the converter stage 300.

FIG. 9 illustrates one example of lab generated data for an envelope tracking system. The lab generated data includes a first graph 500, a second graph 510, a third graph 520 and a fourth graph 530.

The first graph 500 includes a first plot 501 of amplitude versus frequency for one example of a baseband signal occupying 1 resource block. The second graph 520 includes a second plot 521 of RF power versus frequency for the baseband signal of the first plot 501.

The third graph 520 includes a third plot 521 of amplitude versus frequency for another example of a baseband signal occupying 4 resource blocks. The fourth graph 530 includes a fourth plot 531 of RF power versus frequency for the baseband signal of the third plot 521.

The lab data also shows RMS voltages for the baseband signals occupying different numbers of resource blocks. As shown in FIG. 9, the RMS voltage changes based on the number of resource blocks in the signal.

Although FIG. 9 illustrates one example of lab generated data, a signal can exhibit different characteristics depending on a wide variety of factors. Accordingly, other lab data is possible.

Figure 10:
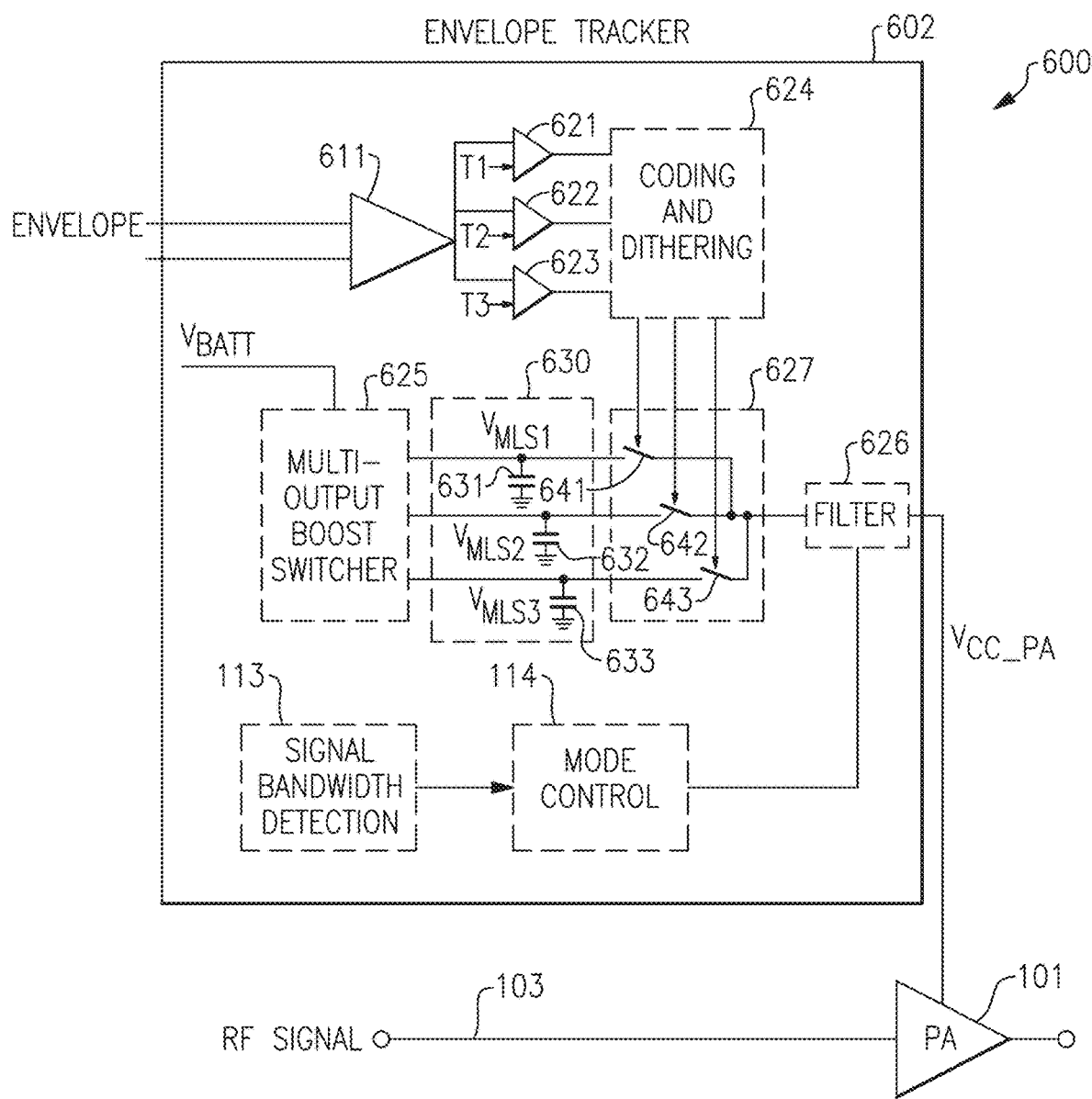
FIG. 10 is a schematic diagram of a power amplifier system according to another embodiment.

FIG. 10 is a schematic diagram of a power amplifier system 600 according to another embodiment. The power amplifier system 606 includes a power amplifier 101 and an envelope tracker 602. The power amplifier 101 provides amplification to a radio frequency signal 103.

The envelope tracker 602 of FIG. 10 illustrates another embodiment of an envelope tracker that operates with automatic mode selection. However, the teachings herein are applicable to envelope trackers implemented in a wide variety of ways. Accordingly, other implementations are possible.

The envelope tracker 602 receives an envelope signal corresponding to an envelope of the radio frequency signal 103. In this example, the envelope signal is differential. Additionally, the envelope tracker 602 generates a power amplifier supply voltage $V_{CC\_PA}$, which supplies power to the power amplifier 101.

The illustrated envelope tracker 602 includes a signal bandwidth detection circuit 113, a mode control circuit 114, an envelope amplifier 611, a first comparator 621, a second comparator 622, a third comparator 623, a coding and dithering circuit 624, a multi-output boost switcher 625, a filter 626, a switch bank 627, and a capacitor bank 630. The capacitor bank 630 includes a first capacitor 631, a second capacitor 632, and a third capacitor 633. Additionally, the switch bank 627 includes a first switch 641, a second switch 642, and a third switch 643.

The envelope amplifier 611 amplifies the envelope signal to provide an amplified envelope signal to the first to third comparators 621-623. The first to third comparators 621-623 compare the amplified envelope signal to a first threshold T1, a second threshold T2, and a third threshold T3, respectively. The results of the comparisons are provided to the coding and dithering circuit 624, which processes the results to control selection of switches of the switch bank 627. The coding and dithering circuit 624 can activate the switches while using coding and/or dithering to reduce artifacts arising from opening and closing the switches.

Although an example with three comparators is shown, more or fewer comparators can be used. Furthermore, the coding and dithering circuit 624 can be omitted in favor of controlling the switch bank in other ways. In a first example, coding but not dithering is used. In a second example, dithering but not coding is used. In a third example, neither coding nor dithering is used.

The multi-output boost switcher 625 generates a first regulated voltage $V_{MLS1}$, a second regulated voltage $V_{MLS2}$, and a third regulated voltage $V_{MLS3}$ based on providing DC-to-DC conversion of a battery voltage $V_{BATT}$. Although an example with three regulated voltages is shown, the multi-output boost switcher 625 can generate more or fewer regulated voltages. In certain implementations, at least a portion of the regulated voltages are boosted relative to the battery voltage $V_{BATT}$. In some configurations, one or more of the regulated voltages is a buck voltage having a voltage lower than the battery voltage $V_{BATT}$.

The capacitor bank 630 aids in stabilizing the regulated voltages generated by the multi-output boost switcher 625. For example, the capacitors 631-633 operate as decoupling capacitors.

The filter 626 processes the output of the switch bank 627 to generate the power amplifier supply voltage $V_{CC\_PA}$. By controlling the selection of the switches 641-643 over time based on the envelope signal, the power amplifier supply voltage $V_{CC\_PPA}$ is generated to track the envelope signal.

The bandwidth detection circuit 113 processes the envelope signal to detect a signal bandwidth of the radio frequency signal 103. In one example, the signal bandwidth detection circuit 113 detects the signal bandwidth of the radio frequency signal 103 based on determining a number of RBs used by the radio frequency signal 103. Furthermore, the mode control circuit 114 processes the detected signal bandwidth to control a filtering characteristic of the filter 626.

Thus, the mode selection circuit 114 controls a mode of the envelope tracker 602 to one of multiple different modes associated with different filtering characteristics of the filter 626. The modes are suitable for processing envelope signals of different bandwidths. Thus, the envelope tracker 602 can be operated in a mode that is power efficient with respect to a given signal bandwidth.

In certain implementations, the mode control circuit 114 controls a filter bandwidth and/or cutoff frequency based on the detected bandwidth signal from the signal bandwidth detection circuit 113.

Figure 11A:
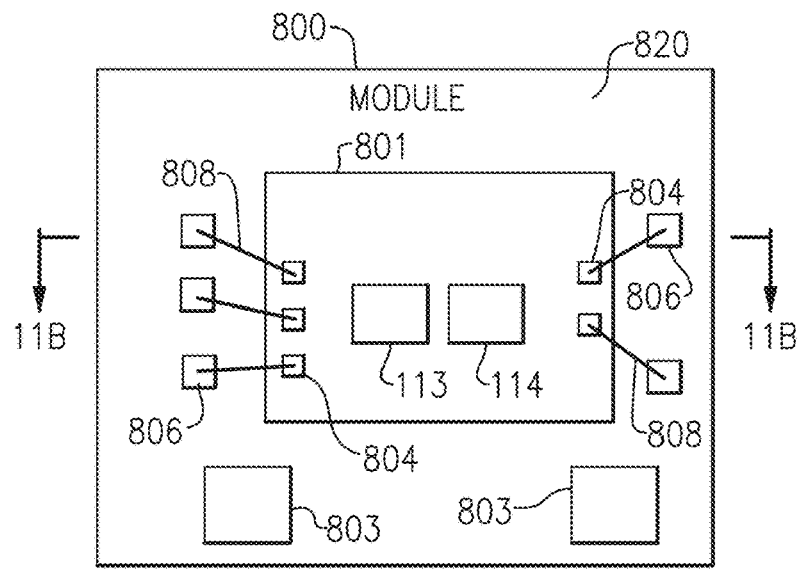
FIG. 11A is a schematic diagram of one embodiment of a packaged module.
Figure 11B:
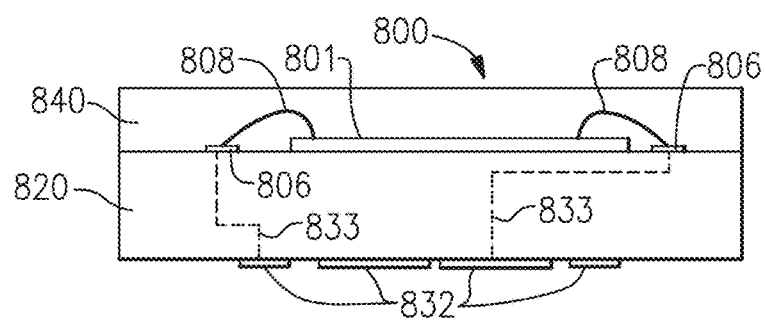
FIG. 11B is a schematic diagram of a cross-section of the packaged module of FIG. 11A taken along the lines 11B-11B.

FIG. 11A is a schematic diagram of one embodiment of a packaged module 800. FIG. 11B is a schematic diagram of a cross-section of the packaged module 800 of FIG. 11A taken along the lines 11B-11B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a signal bandwidth detection circuit 113, and a mode control circuit 114, which can be as described earlier. In one embodiment, the die 301 further includes a power amplifier.

The packaging substrate 820 can be configured to receive a plurality of components such as the die 801 and the surface mount components 803, which can include, for example, surface mount capacitors and/or inductors.

As shown in FIG. 11B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 11B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 12:
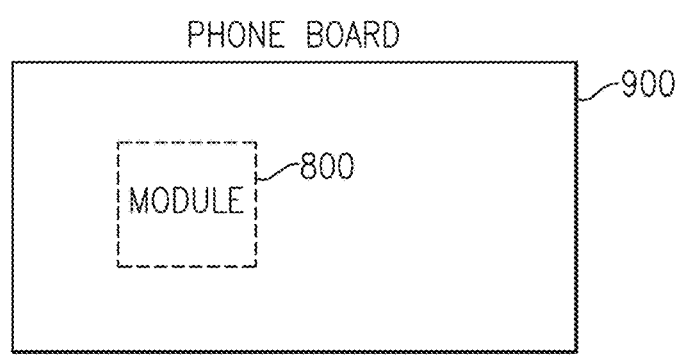
FIG. 12 is a schematic diagram of one embodiment of a phone board.

FIG. 12 is a schematic diagram of one embodiment of a phone board 900. The phone board 900 includes the module 800 shown in FIGS. 10A-10B attached thereto. Although not illustrated in FIG. 12 for clarity, the phone board 800 can include additional components and structures.

Applications

Some of the embodiments described above have provided examples in connection with wireless devices or mobile phones. However, the principles and advantages of the embodiments can be used for any other systems or apparatus that have needs for envelope trackers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to provide amplification to a radio frequency signal and to receive power from a power amplifier supply voltage; and
an envelope tracker including a power amplifier supply circuit configured to generate the power amplifier supply voltage based on an envelope of the radio frequency signal, and a mode control circuit configured to control the power amplifier supply circuit based on a bandwidth signal indicating a bandwidth of the radio frequency signal, and further including a signal bandwidth detection circuit configured to generate the bandwidth signal based on an envelope signal indicating the envelope of the radio frequency signal.

2. The power amplifier system of claim 1 wherein the power amplifier supply circuit includes a multi-level switching circuit.

3. A power amplifier system comprising:
a power amplifier configured to provide amplification to a radio frequency signal and to receive power from a power amplifier supply voltage; and
an envelope tracker including a power amplifier supply circuit configured to generate the power amplifier supply voltage based on an envelope of the radio frequency signal, and a mode control circuit configured to control the power amplifier supply circuit based on a bandwidth signal indicating a bandwidth of the radio frequency signal, the power amplifier supply circuit including a multi-level switching circuit and a filter circuit configured to filter an output of the multi-level switching circuit to generate the power amplifier supply voltage, the mode control circuit configured to control the filter circuit based on the bandwidth signal.

4. The power amplifier system of claim 3 wherein the mode control circuit is configured to control a filter bandwidth of the filter circuit based on the bandwidth signal.

5. The power amplifier system of claim 3 wherein the mode control circuit is configured to control a corner frequency of the filter circuit based on the bandwidth signal.

6. The power amplifier system of claim 3 further comprising a signal bandwidth detection circuit configured to generate the bandwidth signal based on an envelope signal indicating the envelope of the radio frequency signal.

7. A power amplifier system comprising:
a power amplifier configured to provide amplification to a radio frequency signal and to receive power from a power amplifier supply voltage; and
an envelope tracker including a power amplifier supply circuit configured to generate the power amplifier supply voltage based on an envelope of the radio frequency signal, and a mode control circuit configured to control the power amplifier supply circuit based on a bandwidth signal indicating a bandwidth of the radio frequency signal, the mode control circuit is configured to control a filtering of the power amplifier supply voltage based on the bandwidth signal.

8. The power amplifier system of claim 1 wherein the mode control circuit is further configured to process the bandwidth signal to determine a number of resource blocks.

9. A packaged module comprising:
a package substrate; and
a semiconductor die attached to the package substrate and including a power amplifier configured to provide amplification to a radio frequency signal and to receive power from a power amplifier supply voltage, and further including an envelope tracker including a power amplifier supply circuit configured to generate the power amplifier supply voltage based on an envelope of the radio frequency signal, the envelope tracker further including a mode control circuit configured to control the power amplifier supply circuit based on a bandwidth signal indicating a bandwidth of the radio frequency signal, the mode control circuit configured to control a filtering of the power amplifier supply voltage based on the bandwidth signal.

10. The packaged module of claim 9 wherein the power amplifier supply circuit includes a multi-level switching circuit.

11. The packaged module of claim 10 wherein the envelope tracker further includes a filter circuit configured to filter an output of the multi-level switching circuit to generate the power amplifier supply voltage, the mode control circuit configured to control the filter circuit based on the bandwidth signal.

12. The packaged module of claim 11 wherein the mode control circuit is configured to control a filter bandwidth of the filter circuit based on the bandwidth signal.

13. The packaged module of claim 11 wherein the mode control circuit is configured to control a corner frequency of the filter circuit based on the bandwidth signal.

14. A packaged module comprising:
a package substrate; and
a semiconductor die attached to the package substrate and including a power amplifier configured to provide amplification to a radio frequency signal and to receive power from a power amplifier supply voltage, and further including an envelope tracker including a power amplifier supply circuit configured to generate the power amplifier supply voltage based on an envelope of the radio frequency signal, the envelope tracker further including a mode control circuit configured to control the power amplifier supply circuit based on a bandwidth signal indicating a bandwidth of the radio frequency signal, and the envelope tracker further including a signal bandwidth detection circuit configured to generate the bandwidth signal based on an envelope signal indicating the envelope of the radio frequency signal.

15. The packaged module of claim 4 wherein the mode control circuit is configured to control a filtering of the power amplifier supply voltage based on the bandwidth signal.

16. A packaged module comprising:
a package substrate; and
a semiconductor die attached to the package substrate and including a power amplifier configured to provide amplification to a radio frequency signal and to receive power from a power amplifier supply voltage, and further including an envelope tracker including a power amplifier supply circuit configured to generate the power amplifier supply voltage based on an envelope of the radio frequency signal, the envelope tracker further including a mode control circuit configured to control the power amplifier supply circuit based on a bandwidth signal indicating a bandwidth of the radio frequency signal, the mode control circuit further configured to process the bandwidth signal to determine a number of resource blocks.

17. A method of envelope tracking in a mobile device, the method comprising:
amplifying a radio frequency signal using a power amplifier;
powering the power amplifier using a power amplifier supply voltage;
using an envelope tracker, generating the power amplifier supply voltage based on an envelope of the radio frequency signal; and
using a mode control circuit of the envelope tracker, controlling the power amplifier supply voltage based on a bandwidth signal indicating a bandwidth of the radio frequency signal, the generating the power amplifier supply voltage including using a multi-level switching circuit, the using the mode control circuit including, based on the bandwidth signal, controlling a filter to adjust an output of the multi-level switching circuit, and the mode control circuit configured to control the filter based on the bandwidth signal.

18. The method of claim 17 wherein the using the mode control circuit, includes controlling a filter bandwidth of the filter based on the bandwidth signal.

19. The power amplifier system of claim 1 wherein the power amplifier supply circuit includes a multi-level switching circuit and a filter circuit configured to filter an output of the multi-level switching circuit to generate the power amplifier supply voltage, the mode control circuit configured to control the filter circuit based on the bandwidth signal.

20. The power amplifier system of claim 19 wherein the mode control circuit is configured to control a filter bandwidth of the filter circuit based on the bandwidth signal.

* * * * *